(12) United States Patent
Ahn et al.

(10) Patent No.: US 6,432,724 B1
(45) Date of Patent: *Aug. 13, 2002

(54) BURIED GROUND PLANE FOR HIGH PERFORMANCE SYSTEM MODULES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 47 days.

(21) Appl. No.: 09/199,442

(22) Filed: Nov. 25, 1998

(51) Int. Cl.$^7$ .............................................. H01L 21/44
(52) U.S. Cl. ...................................... 436/667; 438/960
(58) Field of Search ................................ 438/667, 960

(56) References Cited

PUBLICATIONS

R.L. Smith, "Applications of Porous Silicon to Microstructure Fabrication", The Electrochemical Society Proceedings, Vol. 94–32, 1994, pp. 281–288.*
T. Mimura et al., "System module: a new Chip–On–Chip module technology," Proc. of, IEEE 1997 Custom Integrated Circuit Conf., pp. 439–442, 1997.
R.J. Jensen et al., "Mission: MCM, Designing for Reliability in Harsh Environments", Advanced Packaging, Jan., 1998, pp. 22–26.
M. Gribbons et al., "Finite–Difference Time–Domain Analysis of Pulse Propagation in Multichip Module Interconnects", IEEE Transactions on Components, Hybrids, and Manufacturing Technology, vol. 16, No. 5, Aug. 1993, pp. 490–497.
R. Downing et al., "Decoupling Capacitor Effects on Switching Noise", IEEE Transactions on Components, Hybrids, and Manufacturing Technology, vol. 16, No. 5, Aug. 1993, pp. 484–489.
D.C. Thomas et al., "A Multilevel Tungsten Interconnect Technology", Digest of 1988 IEDM, 1988, pp. 466–469.
V.M. Dubin et al., "Porous Silicon: Metal Plating and Anodic Oxidation", The Electrochemical Society Proceedings, vol. 94–32, 1994, pp. 299–311.
R. Herino et al., "Nickel Plating on porous Silicon", J. Electrochem. Soc., Oct. 1985, pp. 2513–2514.
R.L. Smith, "Applications of Porous Silicon to Microstructure Fabrication", The Electrochemical Society Proceedings, vol. 94–32, 1994, pp. 281–288.
S.S. Tsao et al., "Tungsten deposition on porous silicon for formation of buried conductors in single crystal silicon", Appl. Phys. Lett. vol. 49, No. 7, Aug. 18, 1986, pp. 403–405.
R.S. Blewer et al., "Tungsten Depostions on Porous Silicon for the Formation of Buried Layer Conductors", Tungsten and Other Refractory Metals for VLSI Applications II, Proc. of 1986 Workshop, Ed. By E.K. Broadbent, materials research Society, 1987, pp. 401–407.

(List continued on next page.)

*Primary Examiner*—John F Niebling
*Assistant Examiner*—David A Zarneke
(74) *Attorney, Agent, or Firm*—Dickstein Shapiro Morin & Oshinsky LLP

(57) ABSTRACT

A method and apparatus for producing buried ground planes in a silicon substrate for use in system modules is disclosed. Conductor patterns are printed on the surface of the silicon substrate. Pores are created in the printed conductor patterns by a chemical anodization process. The pores are then filled with a conductive metal, such as tungsten, molybdenum, or copper by a selective deposition process to produce a low impedance ground buried in the substrate.

36 Claims, 7 Drawing Sheets

PUBLICATIONS

K–M Chang et al., "Influences of damage and contamination from reactive ion etching on selective tungsten depositions in a low–pressure chemical–vapor deposition reactor", J. Appl. Phys. vol. 80, No. 5, Sep. 1, 1996, pp. 3056–61.

A. Kobayashi et al., "The deposition rate for Cu–CVD with Cu(hfac)(tmvs)" Advanced Metallization and Interconnect systems for ULSI applications, Conference Proceedings ULSI XII, Materials research Society, 1997, pp. 177–183.

* cited by examiner

BURIED GROUND PLANE FOR HIGH PERFORMANCE SYSTEM MODULES

BACKGROUND OF THE INVENTION

1. Field of the Invention

The present invention relates generally to semiconductor circuits, and more particularly to substrates having buried ground planes and their method of processing.

2. Description of the Related Art

As improved technology is developed, the size of semiconductor components, and correspondingly the size of end-product equipment in which they are used, continues to decrease. This has led to the concept of a "system on a chip." This concept of a "system on a chip" has been around since the very large scale integration (VLSI) era. As integrated circuit technology enters the ultra large scale integration (ULSI) era, the desire for a "system on a chip" is increasing.

The concept of a system on a chip refers ideally to a computing system in which all the necessary integrated circuits are fabricated on a single wafer or substrate, as compared with today's method of fabricating many chips of different functions, i.e., logic and memory, and connecting them to assemble a system. There are problems, however, with the implementation of a truly high performance system on a chip because of vastly different fabrication processes and different manufacturing yields for the logic and memory circuits. To overcome some of these problems, a "system module" has been developed. A system module may consist of two chips, i.e., a logic chip and a memory chip, with one stacked on the other in a structure called Chip-on-Chip (COC) using a micro bump bonding (MBB) technology. The resulting dual-chip structure is mounted on a silicon substrate. Additional components and chips may also be mounted on the silicon substrate.

The multiple chips mounted on the single substrate in a system module typically include different circuits, i.e., some analog circuits and some digital circuits. This requires a low impedance ground in the system module to suppress digital noise that may appear in the analog circuits of these mixed mode circuits. Digital noise is the side effect of the switching of the logic circuits. High-speed synchronous digital integrated circuits require large switching currents which can induce noise on the power distribution networks and ground busses due to the finite resistance and inductance in these circuits. The noise may consist of voltage spikes appearing at the power supply terminals of the chip with the switching activity. Power supply noise can have a significant effect due to simultaneous switching noise in CMOS integrated circuits. These problems are more severe in mixed-mode circuits and require careful design of the power distribution systems.

Thus, a silicon substrate with a low impedance built-in ground plane is necessary for the system modules to suppress noise. It is also desirable for a built-in ground plane to be planar with the surface of the substrate to maintain a flat surface on the substrate upon which various chips, active circuits, and passive components (such as decoupling capacitors and termination resistors) can be subsequently mounted. A conventional method for forming buried conductors in a substrate is the use of heavy ion implantation of conducting atoms into the substrate to form the conductor. This approach, however, is not economically viable due to the required high-current, high-energy implanters, and may also cause damage to the overlying substrate. Another conventional method for fabricating a multilevel interconnect is to implant silicon into silicon oxide followed by a selective deposition of tungsten to build a multi-layer structure with low electrical resistivity. This method, however, is suitable only for fabricating a buried conductor in a silicon oxide, and not in a silicon substrate as is required in a system module.

Thus, there exists a need for an apparatus and method for simply and inexpensively fabricating a buried ground plane in a silicon substrate for use in multi-chip system modules.

SUMMARY OF THE INVENTION

The present invention provides a simple and low-cost scheme for producing a buried ground plane in a silicon substrate. In accordance with the present invention, the desired conductors are patterned by ordinary lithography on the surface of the silicon substrate in a mesh pattern to leave room for other chips and components to be mounted. A porous structure is produced only in the patterned conductors by depositing silicon nitride windows on the silicon and subjecting the wafer to a chemical anodization process. After the formation of the pores, the pores are then filled with a conductive metal by the use of a selective deposition technique. The filled pores may be subjected to a high-temperature annealing process to convert the deposited conductive metal to a metal silicide.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiment illustrated in FIGS. 1–7. Other embodiments may be utilized and structural or logical changes may be made without departing from the spirit or scope of the present invention.

The terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
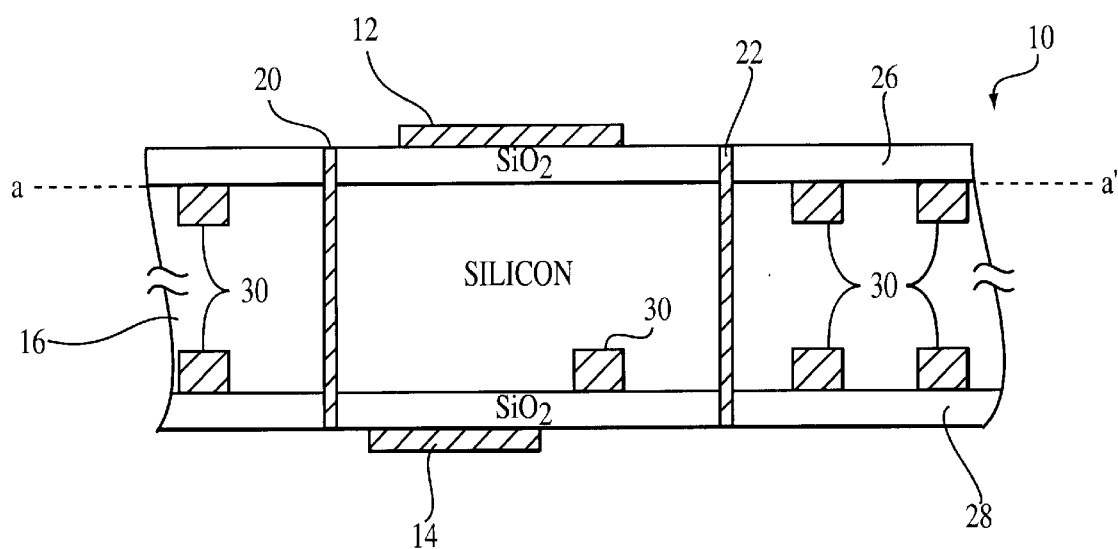
FIG. 1 illustrates a cross-sectional view of a portion of a silicon substrate with buried ground planes.

A cross-sectional diagram of a portion of a wafer 10 having buried ground planes is illustrated generally in FIG. 1. The term buried as used herein refers both to covered conductors, i.e., under the surface and concealed from view, and to conductors that are formed in the substrate whose top surface is planar with the surface of the substrate. Wafer 10 consists of a first level top conductor 12 and a first level bottom conductor 14. A silicon interposer 16 is provided between the conductors 12, 14. Via holes 20, 22 are provided through the wafer 10 to provide for interconnection between the top and bottom surfaces of wafer 10. A layer 26 of insulating material, such as silicon dioxide ($SiO_2$), may be provided between top conductor 12 and silicon interposer 16. Similarly, a layer of insulating material 28, such as silicon dioxide ($SiO_2$), may be provided between bottom conductor 14 and silicon interposer 16. Buried ground planes 30 are provided within the silicon interposer 16. The buried ground planes 30 provide a low-impedance ground connection suitable for suppressing noise produced by digital circuits that may be mounted on silicon interposer 16.

Figure 2:
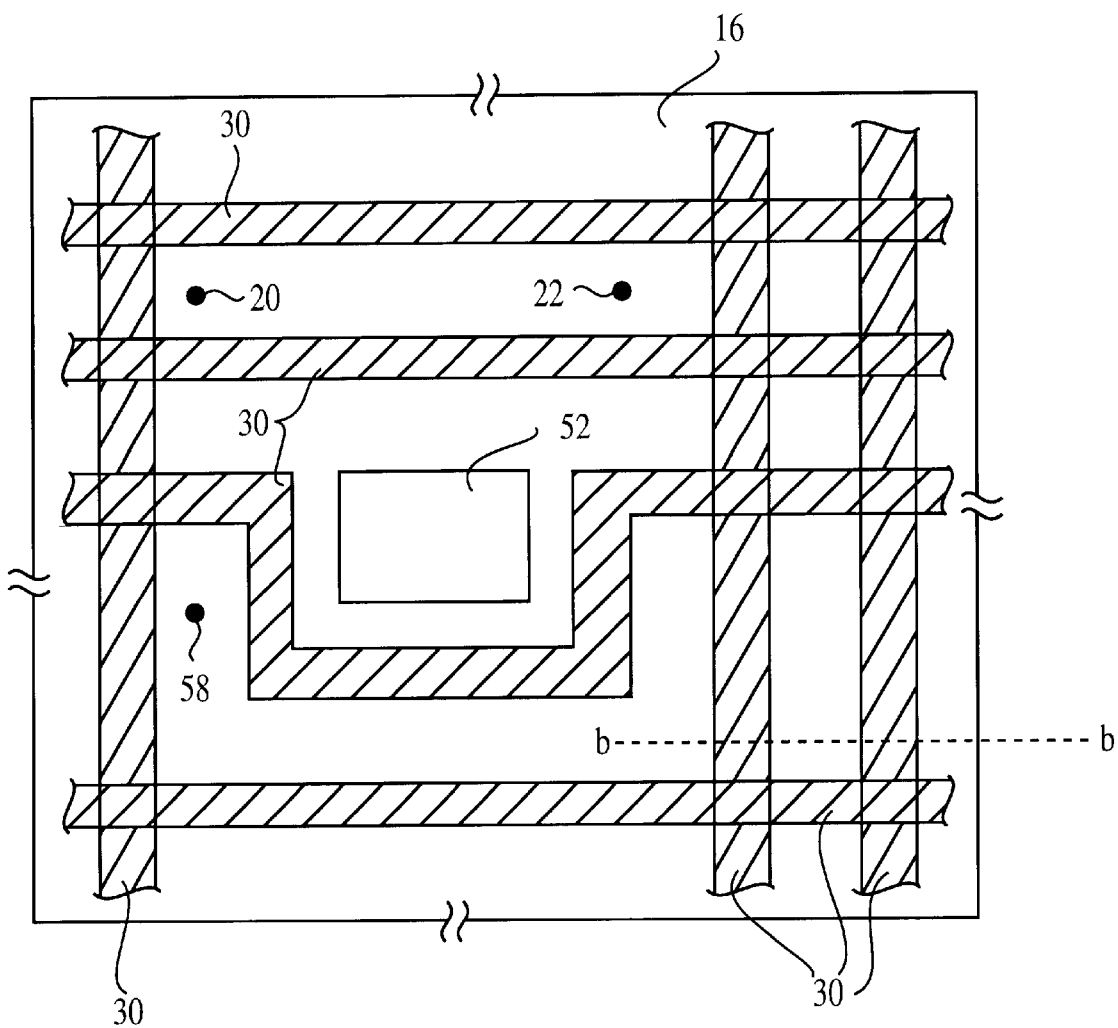
FIG. 2 illustrates a top view of a portion of the silicon substrate of FIG. 1 with buried ground planes.

FIG. 2 illustrates a top view of a portion of the silicon substrate 10 of FIG. 1 across the line a-a'. Space 52 is left between conductors 30 for mounting or integrating chips and/or components. Ground planes 30 may be formed in a mesh pattern to allow for areas such as space 52.

The processes for forming buried ground plane conductors in a silicon substrate in accordance with the present invention is as follows. The pattern for the desired conductors, such as conductors 30 of FIG. 2, is printed on the surface of silicon substrate 16 by conventional lithography or any other method for printing a pattern on the surface of substrate 16 as is known in the art. Space 52 may be left between conductors 30 for other chips and components to be mounted.

Figure 3A:
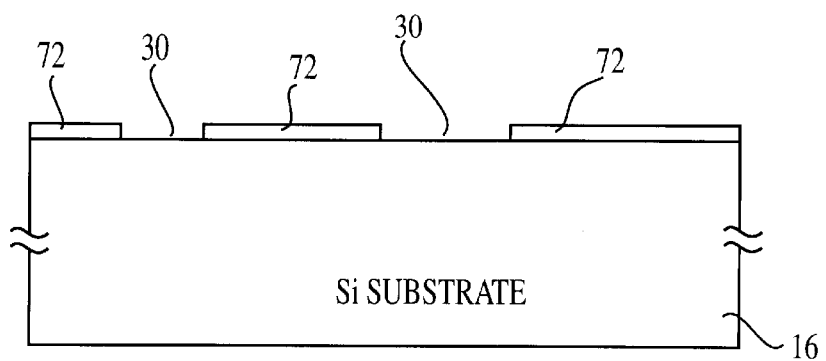
FIGS. 3A, 3B and 3C illustrate a cross-sectional view of the wafer of FIG. 2 during intermediate processes in accordance with the method of the present invention.

Once the pattern for conductors 30 has been printed on the surface of substrate 16, a protective layer 72, such as for example silicon nitride, is deposited to form windows on the surface of the silicon substrate 16 in which only the printed pattern areas for conductors 30 are left exposed. FIG. 3A illustrates a cross-sectional diagram of silicon substrate 16 along line b-b' in FIG. 2 after the deposition of the silicon nitride windows. The deposition of a layer 72 of silicon nitride covers the surface of substrate 16, except for the areas where the pattern for conductors 30 has been printed. The preferable thickness for the layer 72 of silicon nitride is approximately 100 nm.

Figure 3B:
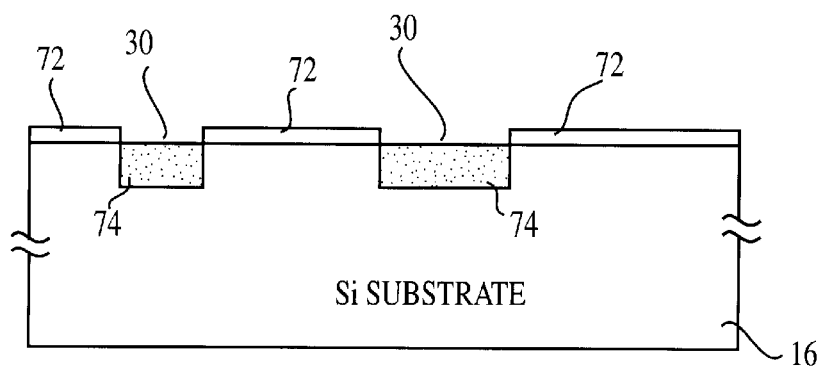

The substrate 16 is then subjected to a chemical anodization process, as is well known in the art, to form a porous layer in the areas not covered with the layer 72 of silicon nitirde, i.e., the areas where the pattern for conductors 30 has been printed. Porous silicon may be formed by the anodization of silicon in aqueous solutions of hydroflouric acid. Pores are etched into the silicon during the anodization process. The resulting structure is illustrated in FIG. 3B. The areas of silicon substrate 16 which have been printed with the pattern for conductors 30 contain a porous layer 74 in substrate 16 created by the anodization process. Those portions of the substrate 16 covered with layer 72 of silicon nitride do not have a porous layer. It is well known that under appropriate anodic conditions, silicon can be converted into a highly porous material. The porosity may be controlled in the 30%–85% range, i.e., the pores in the silicon can comprise approximately 30 to 85% of the total volume within the silicon substrate 16. Thus, a porosity of 50% indicates a material in which half of its volume is comprised of pores within the material.

After the formation of the pores in the substrate 16, a conductor 30 is formed by filling the pores with a conductive metal 76. Since the conductors 30 usually must be able to withstand subsequent high temperature processing, it is preferable to use refractory metals to form the conductors, such as tungsten (W) or molybdenum (Mo) or their suicides. Refractory metals are difficult to pattern by chemical mechanical polishing or standard photolithographic techniques since they are chemically inert. As such, it is desirable to have a self-aligned process that does not require any patterning of the metal. The use of a selective deposition technique, as is known in the art, provides a self aligned process that does not require any patterning of the metal. For example, if tungsten is used, the chemical vapor deposition (CVD) may be based on tungsten hexaflouride ($WF_6$). The chemical-vapor-deposited tungsten process using either $WF_6/H_2$ or $WF_6/SiH_4$ chemistry is well known in the art. The tungsten hexaflouride will react with the areas of the exposed substrate 16, but not with the areas of substrate 16 covered with layer 72 of silicon nitride. This will selectively deposit the tungsten in the porous layers 74 in silicon substrate 16 in the areas where the pattern for conductors 30 are printed but not on the areas covered with the silicon nitride layer 72. Molybdenum can be deposited in a similar fashion as tungsten. The deposition of the conductive metal in the pores creates a low impedance buried conductive plane.

Figure 3C:
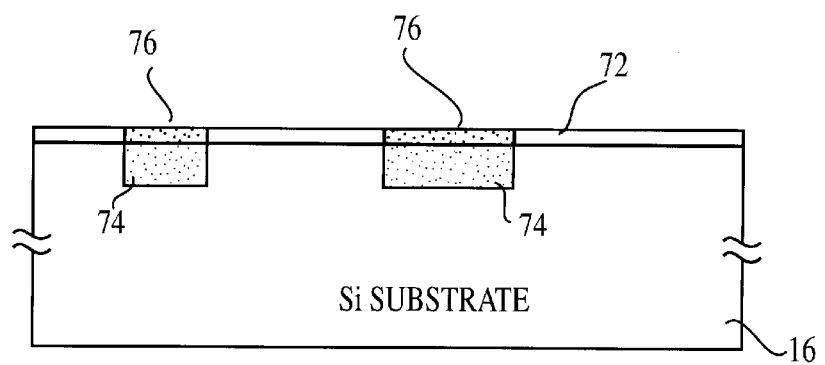

FIG. 3C illustrates the silicon substrate 16 after the conductive metal 76, such as tungsten or molybdenum, has been deposited as described above. The chemical vapor deposition of the metal fills in the pores in the areas where the conductors 30 have been patterned, but does not react with the layer 72 of silicon nitride.

As an alternative to the above, copper may be used as the conductive metal for applications which will not require a subsequent high processing temperature. The copper may be deposited into the pores of the areas where conductors 30 have been patterned by a chemical vapor deposition technique similar to that as described above with respect to the chemical vapor deposition of tungsten or molybdenum.

Figure 4:
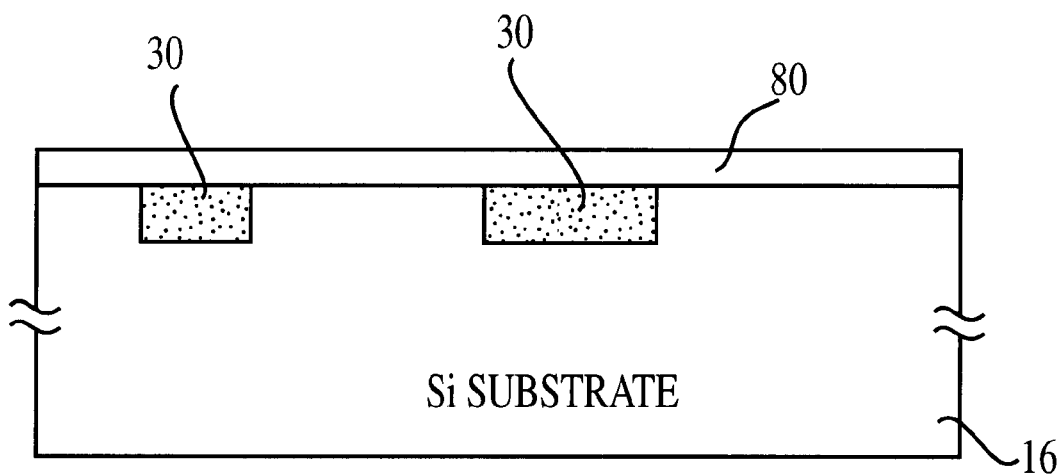
FIG. 4 illustrates a cross-sectional view of a processed wafer with buried ground planes according to a first embodiment of the present invention.

After the deposition of the conducting metal 76, the excess metal and nitride windows may be removed by a chemical mechanical polishing process as is known in the art. As illustrated in FIG. 4, an insulation layer 80, formed of silicon dioxide ($SiO_2$), or alternatively, a high-temperature polymer film with a low dielectric constant, such as for example polyimide, may be deposited.

Figure 5:
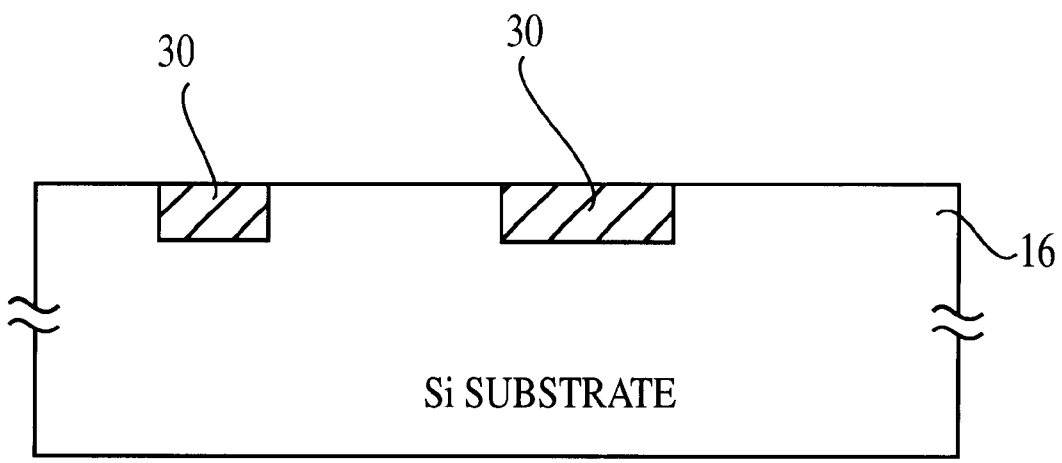
FIG. 5 illustrates a cross-sectional view of a processed wafer according to a second embodiment of the present invention.

Alternatively, instead of depositing an insulating layer 80, the substrate 16 can be further processed to fabricate the conductors 30 with a refractory metal silicide. This may be preferable for applications in which a very high subsequent processing temperature will be required. After the pores have been filled with the refractory metal, the substrate 16 may be subjected to a high temperature annealing to convert the metal in the pores to a silicide. Preferable parameters for this annealing process for tungsten are a temperature greater than approximately 900° C. for up to 30 minutes. This annealing step may be combined with other processes at a later stage if desired. The resulting tungsten silicide has a typical resistivity of 18–20 micro-cm-cm, and can be subjected to subsequent high temperature processing. As illustrated in FIG. 5, the nitride window and excess metal in the channel area may be removed by chemical mechanical polishing to provide a flat and smooth surface for subsequent processing. An insulation layer (not shown), formed of silicon dioxide or a high-temperature polymer film such as polyimide, may be deposited over the surface of substrate 16.

Figure 6A:
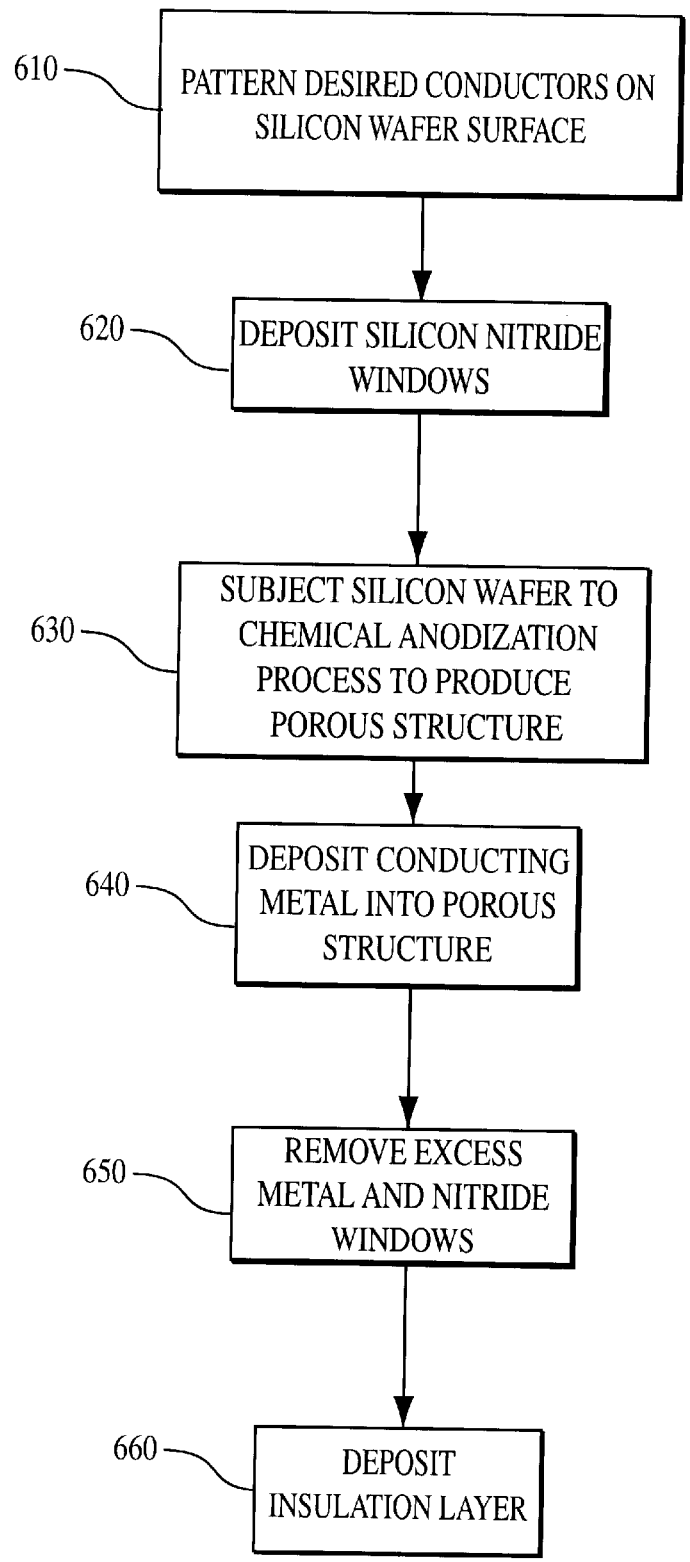
FIGS. 6A and 6B illustrate in flow chart form the steps for forming a buried ground plane in accordance with a first and second method of the present invention.
Figure 6B:
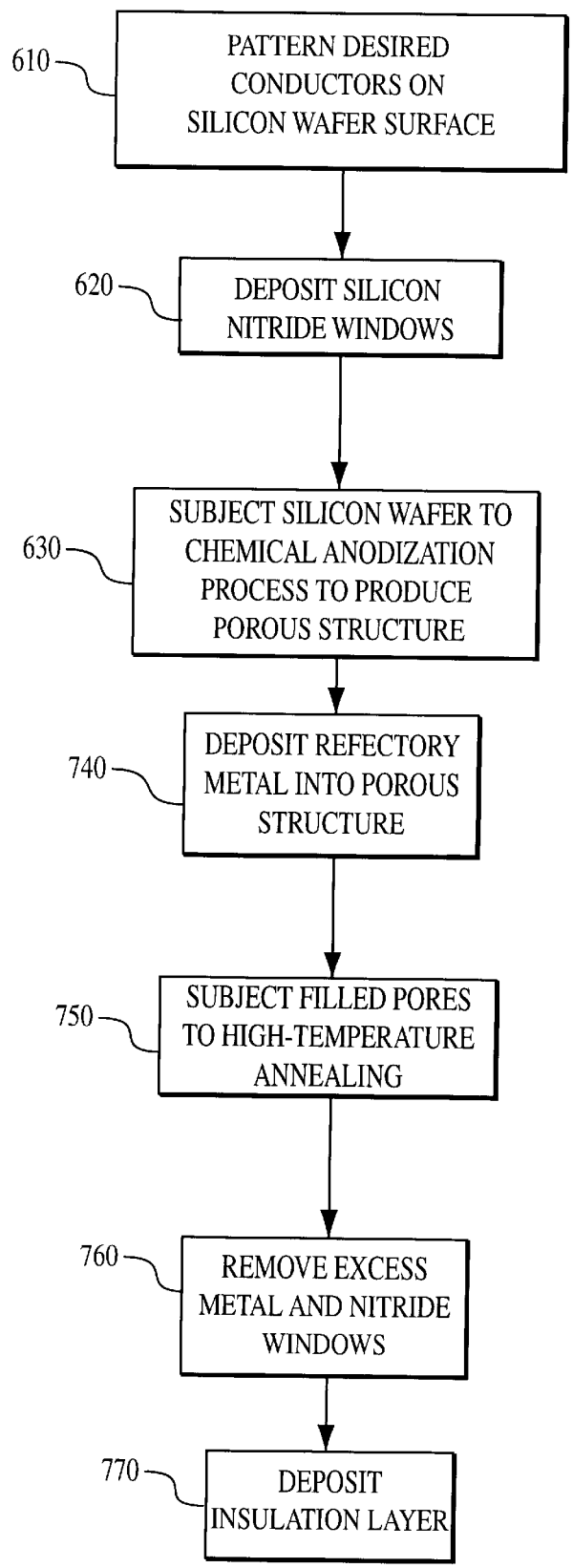

A first and second method of processing buried ground planes in accordance with the present invention is illustrated in flow chart form in FIGS. 6A and 6B. Like steps are referred to by like numerals in each method.

In accordance with a first method of the present invention as illustrated in FIG. 6A, in step 610, the pattern for conductors 30 is printed on the surface of the silicon wafer 16 by conventional lithography or any other method as is known in the art.

The pattern for conductors 30 may be in a mesh pattern as illustrated in FIG. 2 to allow sufficient space between conductors 30 for other chips and components to be mounted.

In step 620, a layer of silicon nitride, preferably 100 nm thick, is deposited on the surface of the substrate 16 to form silicon nitride windows. The layer of silicon nitride does not cover the areas where the pattern for conductors 30 has been printed. In step 630, the wafer is subjected to a chemical anodization process, as is known in the art, to produce a porous layer in the substrate 16 in the areas where the pattern for conductors 30 has been printed.

In step 640, a conductor is formed by depositing a conductive metal into the pores of the porous layer produced in the substrate. As noted previously, refractory metals such as tungsten (W) or molybdenum (Mo) are preferable for applications in which the substrate 16 must be able to withstand subsequent high temperature processing. The metal may be deposited using a selective deposition technique as is known in the art. For applications in which the substrate 16 will not be subjected to subsequent high processing temperatures, copper may be used as the conducting metal. The copper may be deposited by a chemical vapor deposition as is known in the art.

In step 650, the excess metal and nitride windows may be removed utilizing a chemical mechanical polishing process as is known in the art or any other method.

In step 660, an insulation layer 80, formed of silicon dioxide, or alternatively a high-temperature polymer film with a low dielectric constant, such as polyimide, may be deposited on the surface of the substrate 16.

A second method for producing a buried ground plane in accordance with the present invention is illustrated in FIG. 6B. Steps 610, 620, and 630 are identical to those of FIG. 6A and the description will not be repeated here. After the pores have been created in the substrate 16 in step 630, the conductor is created by depositing a refractory metal into the pores in step 740 using a selective deposition technique as is known in the art. In step 750, the substrate 16 is subjected to a high temperature annealing to convert the metal in the pores to a silicide. Preferable parameters for this annealing process for tungsten are a temperature greater than approximately 900° C. for up to 30 minutes. This annealing step may be combined with other processes at a later stage if desired. In step 760, the nitride window and excess metal in the channel area may be removed by chemical mechanical polishing to provide a flat and smooth surface for subsequent processing. In step 770, an insulation layer, formed of silicon dioxide, or alternatively a high-temperature polymer film with a low dielectric constant, such as polyimide, may be deposited on the surface of the substrate 16.

In accordance with the present invention, a buried ground plane can be formed in a silicon substrate simply and inexpensively, without damaging the surrounding environment within the substrate.

Figure 7:
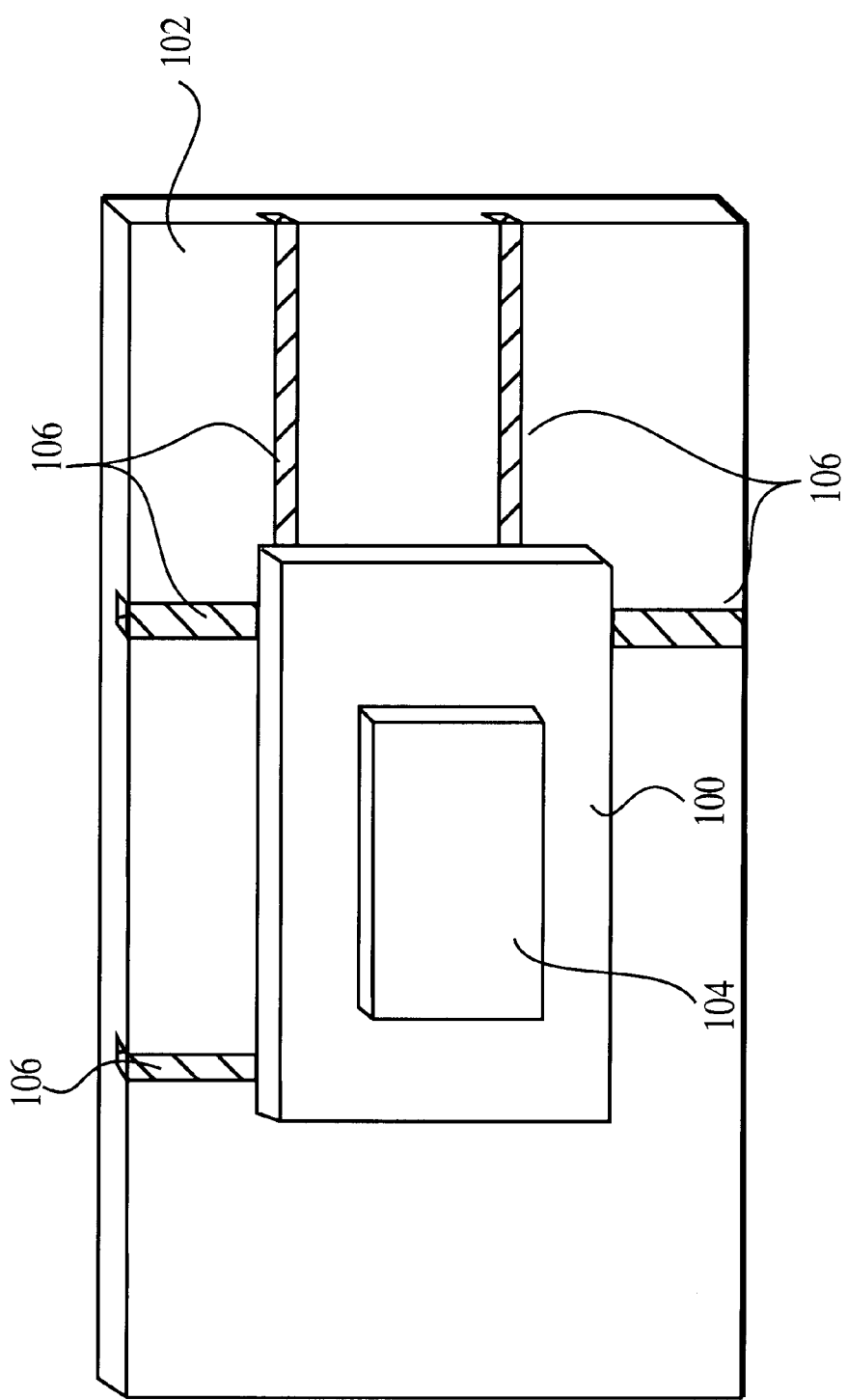
FIG. 7 illustrates in system module in accordance with the present invention.

FIG. 7 illustrates a portion of a system module having buried ground planes constructed in accordance with the present invention. A high performance system module may be provided with a silicon interposer, such as substrate 102, onto which semiconductor chips or active or passive components can be easily mounted. For example, a first chip 104 may be stacked on a second chip 100 using MBB technology as is known in the art to result in a chip-on-chip module. The resulting chip-on-chip module structure may be mounted onto substrate 102 along with additional active or passive components. Substrate 102 may have a plurality of such chip-on-chip module structures and components mounted on its surface. Each of the system modules may consist of at least two chips, some of which may be analog circuits and others digital circuits. Substrate 102, in accordance with the present invention, may be provided with buried low impedance ground conductors 106 to suppress digital noise in the analog circuits of the modules.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method for forming a system module comprising:

mounting a first chip on a second chip to produce a multi-chip structure;

mounting said multi-chip structure over a surface of a substrate having at least one conductor embedded in said substrate, said at least one conductor being formed in said substrate by:

forming a pattern for said at least one conductor on said surface of said substrate;

creating pores in said substrate in areas where said pattern of said at least one conductor is formed; and depositing a conductive metal into said pores to fill said pores created in said substrate.

2. The method according to claim 1, wherein the act of creating pores further comprises:

depositing a protective layer on said surface of said substrate on areas where said pattern of said at least one conductor is not formed; and subjecting said substrate to a chemical anodization process to produce said pores, wherein said protective layer prevents said pores from being formed in said substrate beneath said protective layer.

3. The method according to claim 2, wherein said protective layer is formed of silicon nitride.

4. The method according to claim 3, wherein said layer of silicon nitride is approximately 100 nm thick.

5. The method according to claim 1, wherein said selective deposition technique is a chemical vapor deposition technique.

6. The method according to claim 1, further comprising:

subjecting said substrate to a high-temperature annealing process before mounting said multi-chip structure on said surface of said substrate.

7. The method according to claim 6, further comprising:
performing a chemical mechanical polishing process on said substrate after subjecting said substrate to a high-temperature annealing process.

8. The method according to claim 1, further comprising:
removing excess metal from said surface of said substrate after selectively depositing said conductive metal to fill said pores in said substrate.

9. The method according to claim 8, further comprising:
depositing an insulation layer over all of said surface of said substrate after said removing step and before mounting said multi-chip structure on said surface of said substrate.

10. The method according to claim 9, wherein said insulation layer is formed of a high temperature polymer film.

11. The method according to claim 10, wherein said high temperature polymer film is a polyimide.

12. The method according to claim 9, wherein said insulation layer is formed of silicon dioxide.

13. A method for forming a system module comprising:
mounting a first chip on a second chip to produce a multi-chip structure;
mounting said multi-chip structure over a first surface of a substrate having at least one conductor embedded in said first surface and in second surface opposite said first surface, said at least one conductor being formed in said substrate by:
forming a pattern for said at least one conductor on said first and second surfaces of said substrate;
depositing a protective layer for said first and second surfaces of said substrate on areas where said pattern of said at least one conductor is not formed;
chemically anodizing said substrate to create pores in said substrate in areas where said pattern for said at least one conductor is formed; and
depositing a conductive metal into said pores to fill said pores created in said substrate in said areas where said pattern for said at least one conductor is formed to form said at least one conductor in said substrate.

14. The method according to claim 13, wherein said protective layer is formed of silicon nitride.

15. The method according to claim 13, further comprising:
subjecting said substrate to a high temperature annealing process.

16. The method according to claim 15, further comprising:
performing a chemical mechanical polishing process on said first and second surface of said substrate after said annealing process.

17. The method according to claim 13, further comprising:
depositing an insulation layer on said first and said second surface of said substrate.

18. A method for fabricating a semiconductor substrate, said method comprising:
forming a pattern for at least one conductor on a first surface of semicondutur substrate;
depositing a protective layer on said first surface of said semiconductor substrate on areas where said pattern for said at least one conductor is not formed;
chemically anodizing said semiconductor substrate to create pores in said semiconductor substrate in areas where said pattern of said at least one conductor is formed;
depositing a conductive metal in said pores created in said semiconductor substrate in said areas where said pattern of said at least one conductor is formed to form said at least one ground plane conductor in said semiconductor substrate; and
mounting an integrated circuit chip over an area of said semiconductor substrate.

19. The method according to claim 18 further comprising:
forming a pattern of at least one conductor on a second surface of said semiconductor substrate, said second surface being opposite said first surface;
depositing a protective layer on said second surface of said semiconductor substrate on areas where said pattern of said at least one conductor is not formed;
subjecting said semiconductor substrate to a chemical anodization process to produce said pores, wherein said protective layer prevents said pores from being formed in said semiconductor substrate beneath said protective layer; and
depositing a conductive metal in said pores created in said semiconductor substrate in said areas where said pattern of said at least one conductor is formed to form at least one ground plane conductor in said second surface of said semiconductor substrate.

20. The method according to claim 18, wherein said act of depositing further comprises selectively depositing said conductive metal using a selective deposition technique to fill said pores in said semiconductor substrate.

21. The method according to claim 20, wherein said conductive metal is copper.

22. The method according to claim 20, wherein said conductive metal is a refractory metal.

23. The method according to claim 18 further comprising the step of subjecting said semiconductor substrate to a high-temperature annealing process before mounting said chip over said substrate areas.

24. The method according to claim 19, wherein said ground plane conductor comprises a plurality of buried ground conductors, at least two of said plurality of buried ground conductors being in parallel.

25. The method according to claim 24 further comprising forming a plurality of conductors which extend between said first surface and said second surface of said semiconductor substrate.

26. A method for forming a system module comprising:
forming a pattern for at least one buried ground plane conductor on a first surface of a semiconductor substrate, said pattern including a plurality of parallel stripes;
creating pores in said semiconductor substrate in areas where said pattern of said at least one buried ground plane conductor is formed;
depositing a conductive metal into said pores to fill said pores created in said semiconductor substrate, and
mounting an integrated circuit chip over said first surface of said semiconductor substrate.

27. The method according to claim 26 further comprising:
depositing a protective layer on said first surface of said semiconductor substrate on areas where said pattern for said at least one conductor is not formed; and
subjecting said semiconductor substrate to a chemical anodization process to produce said pores, wherein said protective layer prevents said pores from being formed in said semiconductor substrate beneath said protective layer.

28. The method according to claim 26, wherein said act of depositing further comprises selectively depositing said conductive metal using a selective deposition technique to fill said pores in said semiconductor substrate.

29. The method according to claim 28, wherein said conductive metal is copper.

30. The method according to claim 28, wherein said conductive metal is refractory metal.

31. The method according to claim 26, further comprising the step of subjecting said semiconductor substrate to high-temperature annealing process before mounting said chip over said first surface of said semiconductor substrate.

32. A method for forming a system module comprising:
mounting a first chip on a second chip to produce a multi-chip strucutre;
mounting said multi-chip structure over a first surface of a substrate having at least one buried ground plane conductor in said first surface and a second surface opposite said first surface, said at least one buried ground plane conductor being formed in said substrate by:
forming a pattern for at least one buried ground plane conductor on said first and second surfaces of said substrate;
depositing a protective layer on said first and second surfaces of said substrate on areas where said pattern of said at least one buried ground plane conductor is not formed;
chemically anodizing said substrate to create pores in said substrate in areas where said pattern of said at least one buried ground plane conductor is formed; and
depositing a conductive metal into said pores to fill said pores created in said substrate in said areas where said pattern of said at least one buried ground plane conductor is formed to form said at least one buried ground plane conductor in said first and second surfaces of said substrate.

33. The method according to claim 32, wherein said conductive metal is copper.

34. The method according to claim 32, wherein said conductive metal is a refractory metal.

35. The method according to claim 32 further comprising the step of subjecting said substrate to a high temperature annealing process.

36. A method for forming a system module comprising:
mounting a chip on a chip carrier substrate, said chip carrier substrate having at least one buried ground plane conductor in said first surface and a second surface opposite said furst surface, said at least one buried ground plane conductor being formed in said chip carrier substrate by:
forming a pattern of at least one buried ground plane conductor on said first and second surfaces of said chip carrier substrate;
depositing a protective layer on said first and second surfaces of said chip carrier substrate on areas where said pattern of said at least one buried ground plane conductor is not formed;
chemically anodizing said chip carrier substrate to create pores in said chip carrier substrate in areas where said pattern of said at least one buried ground plane conductor is formed; and
depositing a conductive metal in said pores to fill said pores created in said chip carrier substrate in said areas where said pattern of said at least one buried ground plane conductor is formed to form said at least one buried ground plane conductor in said chip carrier substrate.

* * * * *